United States Patent [19]
Sorba et al.

[11] Patent Number: 4,527,116
[45] Date of Patent: Jul. 2, 1985

[54] PROCESS AND DEVICE FOR SYSTEM CHARACTERIZATION BY SPECTRAL ANALYSIS

[75] Inventors: Antoine Sorba, Le Mesnil Saint-Denis; Gérard J. Attal, Fresne; Georges B. Seignier, Montrouge, all of France; Ahmed M. Hamad, El Agouza, Egypt

[73] Assignee: Ecole Superieure d'Electricite and Enertec, France

[21] Appl. No.: 393,415

[22] Filed: Jun. 29, 1982

[30] Foreign Application Priority Data

Jun. 30, 1981 [FR] France ................................ 81 12872

[51] Int. Cl.³ ............................................. G01R 23/16
[52] U.S. Cl. .................................. 324/77 B; 324/77 C
[58] Field of Search ................. 324/77 R, 77 B, 77 C, 324/77 CS, 77 G

[56] References Cited

U.S. PATENT DOCUMENTS 3,935,437  1/1976  Schmitt et al. ..................... 324/77 B
4,067,060  1/1978  Poussart et al. .................. 324/77 B
4,306,186  12/1981 Nakazawa et al. ............... 324/77 C
4,321,680  3/1982  Bertrand et al. .................. 324/77 B
4,325,023  4/1982  Zigwick ............................ 324/77 B

FOREIGN PATENT DOCUMENTS 2926281  10/1980  Fed. Rep. of Germany .

Primary Examiner—Michael J. Tokar
Attorney, Agent, or Firm—Shenier & O'Connor

[57] ABSTRACT

A pseudo-random measuring signal whose spectrum is constituted by lines of predetermined frequencies spaced apart from each other is applied to a system to be characterized, and one or, successively and one by one, a plurality of lines of the spectrum of the measuring signal are selected for making a comparison in phase and amplitude between the input and the output of the system; for a non-linear system, one or, successively and one by one, a plurality of lines of the spectrum of the measuring signal are eliminated at the input of the system, and the phase and/or amplitude of the corresponding line is measured at the output of the system.

10 Claims, 11 Drawing Figures

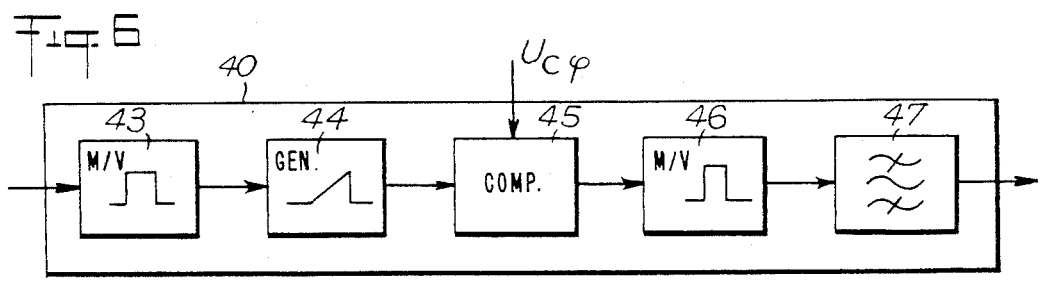
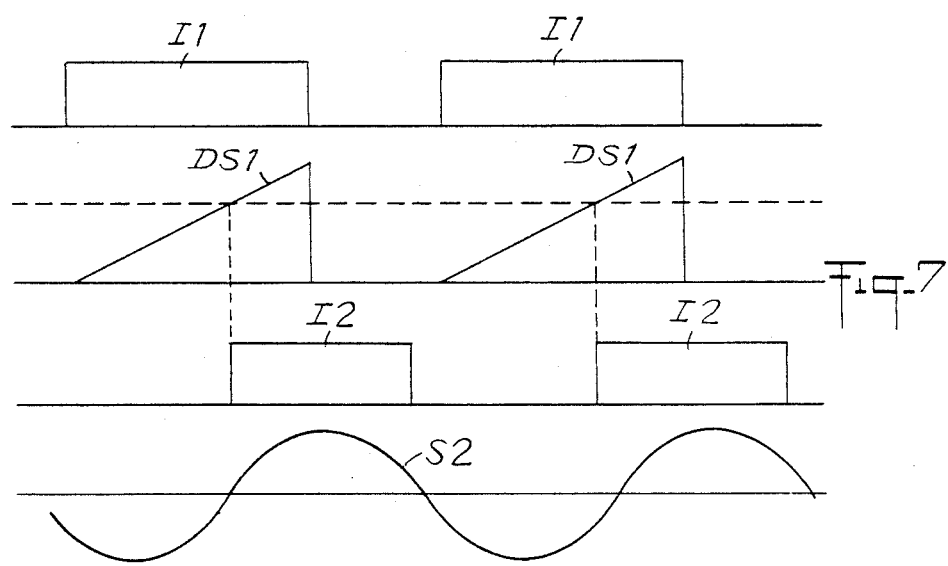
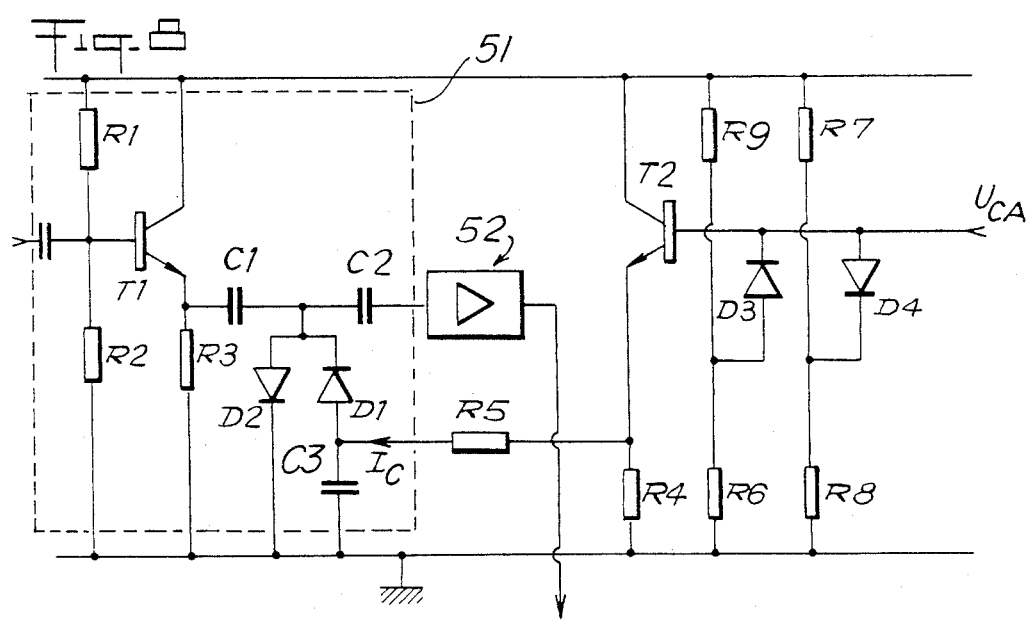

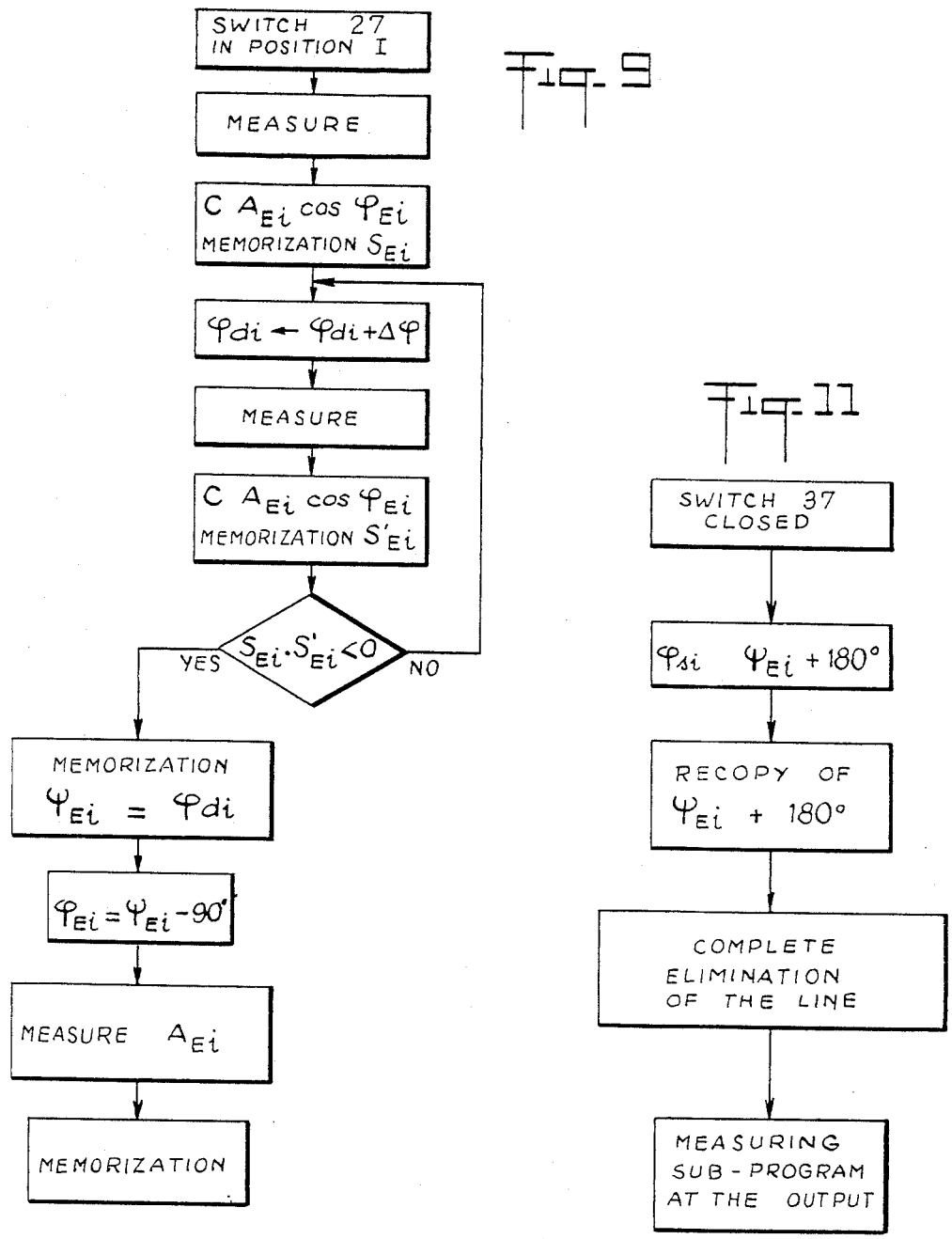

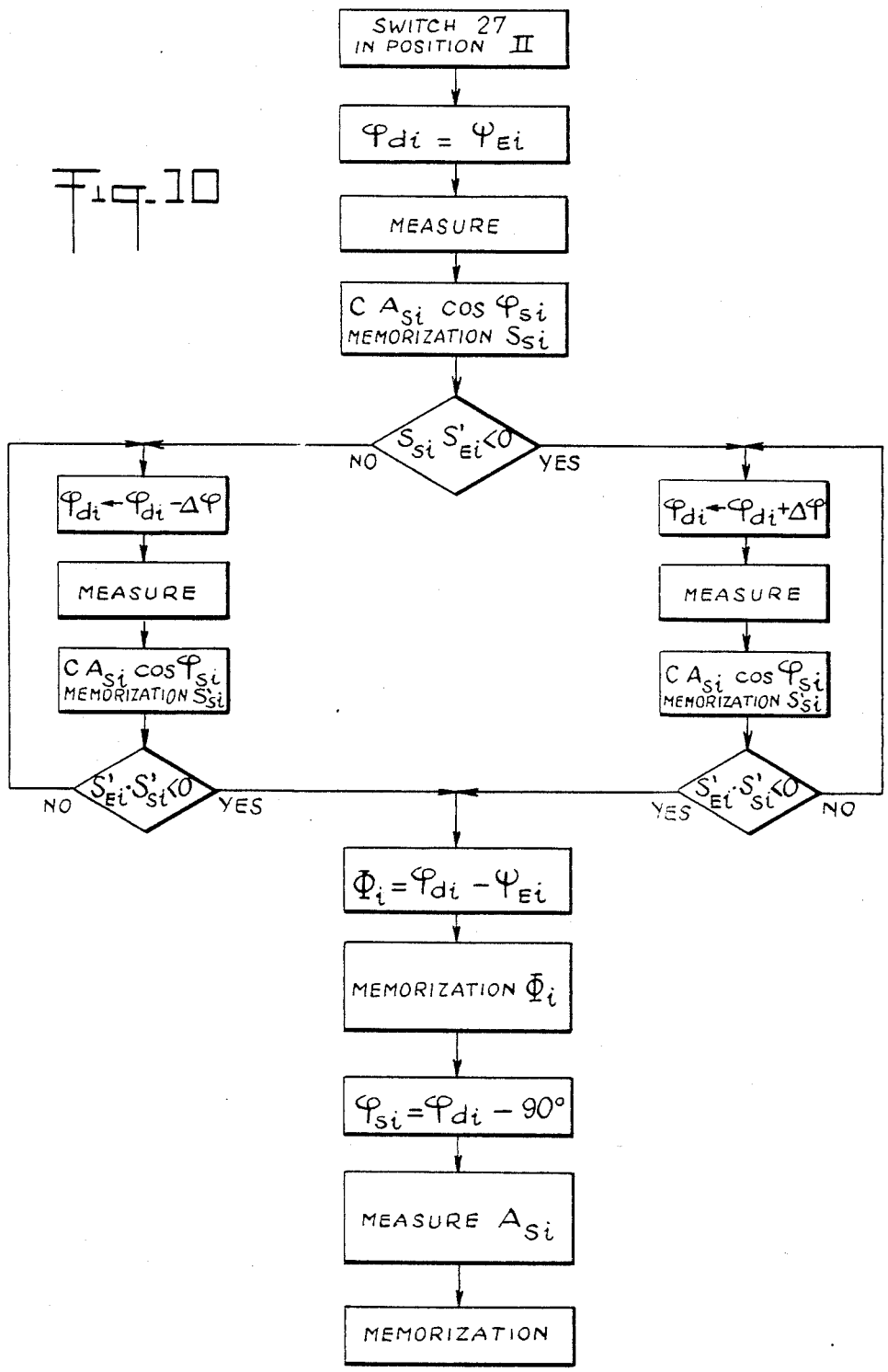

PROCESS AND DEVICE FOR SYSTEM CHARACTERIZATION BY SPECTRAL ANALYSIS

The present invention relates to a process and device for system characterization by spectral analysis.

In the domain of electronic measuring instrumentation, several methods of analysis have been proposed to assess the characteristics of linear systems and of non-linear systems.

As far as linear systems are concerned, particular mention may be made of harmonic analysis, transient analysis and noise analysis.

Harmonic analysis consists in comparing in amplitude and in phase a sinewave signal at the input and at the output of the system to be analysed, the frequency of the signal being varied in a given range. This method is widely used not only in the domain of electricity, but also in mechanics, hydraulics, and the like.

Transient analysis consists in using a pulse and in observing how the system studied modifies the temporal form or the form of the spectrum. Applications thereof consist in the measurement of rise time, delay time, resonances, etc . . . with square-wave signals of long duration vis-à-vis the times to be measured, and in the measurement of the spectrum in extended frequency ranges by using a very brief recurrent pulse as in the case of the time network analyzer.

In the case of noise analysis, the signal used in a random (noise) or pseudo-random signal, analysis being effected by intercorrelation of the signals at the output and input of the system. This method is especially used for analysis of transfer functions in automatic devices in the low or very low frequency domain.

Noise analysis makes it possible to study the system under conditions close to the real conditions of exploitation, whilst harmonic analysis uses a signal confined in the spectral domain and transient analysis uses a signal confined in the temporal domain. However, this method of noise analysis, although it is more realistic, presents the drawback of necessitating a Fourier transform to pass from the pulse response measured to the function of transfer in module and phase.

Assessment of a non-linear system is generally done as a function of the power applied at the input of the system. With this method power output of a system is measured at a frequency or in a frequency range where the input signal furnishes no power.

One-signal analysis consists in applying to the system a sine-wave signal and in measuring either the amplitudes of the harmonics at the output (wave analyzer), or the relative power or rate of distorsion (distorsion-meter).

In the case of two-signal analysis, the input signal is the addition of two sine-wave signals of different frequencies and measurement is also directed to the amplitude or overall or partial power of the output signal which contains linear combinations of the two frequencies of the input signal.

Noise analysis of the non-linear systems consists in measuring the noise power ratio (or N P R). To this end, the output power of the non-linear system is measured in a narrow window in its pass band when it is attacked by a uniform white noise in the whole band then by a uniform white noise in the whole band but attenuated in the measurement window.

As indicated previously for the linear systems, noise analysis places the system studied under realistic measuring conditions, which does not allow one- or two-signal analysis. However, when carrying out analysis of non-linear systems by the N P R method, difficulties are encountered in the production of band-cut filters with a narrow cut band (crevice filters), in the precision of noise measurements and in the measuring time which is inversely proportional to the width of the cut band.

It is an object of the present invention to provide a process of analysis which, on the one hand, enables the advantages of the existing methods to be combined, by joining the realism of noise analysis with the fineness of spectral analysis, and, on the other hand, is applicable both to linear systems and to non-linear systems.

This purpose is attained by means of a process of spectral analysis which, according to the invention, comprises the following steps of:

generating a pseudo-random measuring signal whose spectrum is constituted by lines of predetermined frequencies spaced apart from one another, applying the measuring signal to the system to be characterized, selecting one or, successively and one by one, a plurality of lines of the spectrum of the measuring signal and, for the or each line selected, making a comparison in phase and amplitude between the input and the output of the system, and for a non-linear system, eliminating one or, successively and one by one, a plurality of lines of the spectrum of the measuring signal and, for the or each line eliminated at the input of the system, measuring the phase and/or the amplitude of the corresponding line at the output of the system.

Several advantages of the process according to the invention may already be set forth.

The measuring signal contains information which is virtually as rich as that of white noise, but this information may be exploited more easily than in the case of white noise as the pseudo-random signal is deterministic, reproducible and presents a discrete spectrum (absence of signal between lines).

Analysis of the system is effected finally, line by line, which makes it possible to make measurements which are as precise as those obtained by conventional spectral analysis, but under better conditions since measurement in one frequency is carried out in the presence of all the other lines.

Moreover, in the case of non-linear system analysis, the elimination of a line located at a certain distance from the adjacent lines, of known frequency and of easily measurable amplitude and phase, is an operation more easily carried out than the construction of a match filter for analysis by the N P R method.

According to a particular feature of the process according to the invention, one or more characteristics of the measuring signal are adjustable, such as for example the range of frequency covered, the number of lines, their spaced apart relationship and their amplitude, which constitutes an additional advantage in comparison with the use of white noise.

According to a further feature of the process of the invention, for each line selected, a detection signal, of frequency equal to that of this line, of determined amplitude and of adjustable phase, is generated, the detection signal is superposed on the measuring signal at the input of the system, the phase of the detection signal is adjusted so as virtually to coincide with that of the line selected at the input of the system and a value representing the amplitude of the line selected at the input of the system is measured, the detection signal is superposed on the output signal of the system, the phase of the detection signal is again adjusted so as virtually to coincide with that of the line selected at the output of the system and a value representing the amplitude of the line selected at the output of the system is measured, and the values of adjustment of the phase of the detection signal and the values representing the amplitude of the line selected at the input and the output of the system are recorded.

The measurements relative to each selected line are thus effected by synchronous detection.

According to a further feature of the process of the invention, for each line to be eliminated:

an elimination signal, of frequency equal to that of the line to be eliminated and of adjustable amplitude and phase is generated, and the elimination signal is added to the measuring signal at the input of the system, the phase of the elimination signal is adjusted so as to be in opposition with respect to that of the line to be eliminated, and the amplitude of the elimination signal is adjusted so as to coincide with that of the line to be eliminated.

It is also an object of the invention to provide a device for carrying out the process defined hereinabove.

This purpose is attained by means of a device comprising, according to the invention:

a generator which produces a pseudo-random measuring signal adapted to be applied to the system to be characterized and whose spectrum is constituted by lines of predetermined frequencies spaced apart from one another, a line selector comprising measuring means which furnish, for any one line selected from the lines of the spectrum of the measuring signal, values representing the amplitudes of the line at the input and at the output of the system and the phase shift of the line between the input and the output of the system, and a line eliminator adapted to eliminate any predetermined line from the spectrum of the measuring signal adapted to be applied to the input of the system.

The invention will be more readily understood on reading the following description with reference to the accompanying drawings, in which:

FIG. 6 is a diagram showing an embodiment of the fine phase adjusting circuit of the eliminating signal in the line eliminator of FIG. 5.

FIG. 7 is a timing chart illustrating the functioning of the fine phase adjusting circuit of FIG. 6.

FIG. 8 is a diagram showing an embodiment of the amplitude control circuit of the eliminating signal in the line eliminator of FIG. 5, and FIGS. 9 to 11 are flow charts showing the development of operations carried out by the device of FIG. 1.

Figure 1:
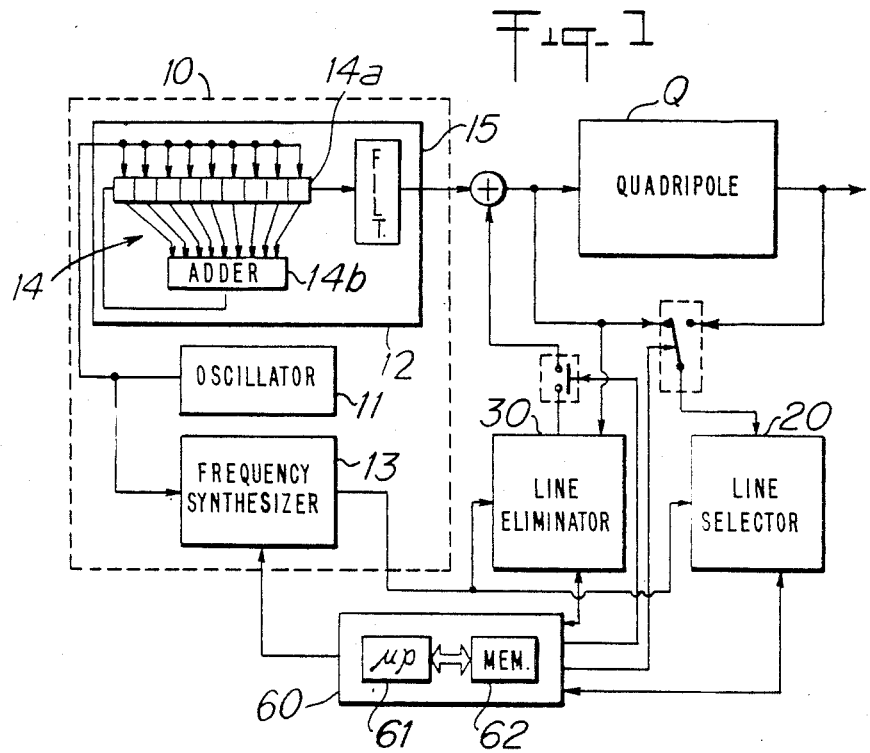
FIG. 1 is a general diagram of an embodiment of the device according to the invention.

Referring now to the drawings, FIG. 1 illustrates the general constitution of an embodiment of an analyzer according to the invention.

A generator assembly 10 comprises a control oscillator 11 which is connected on the one hand to a pseudo-random signal generator 12 and on the other hand to a frequency synthesizer 13. The generator 12 produces the measuring signal which is applied to the input of the system to be studied, for example a quadripole Q. This measuring signal is a pseudo-random signal whose spectrum is formed by lines of predetermined frequencies spaced apart from one another. Different parameters of the measuring signal are advantageously adjustable (covered frequency band, number and spaced apart relationship of the lines, amplitude of the lines). The synthesizer delivers certain fixed frequencies and a frequency in relation with that of any line selected from the spectrum of the measuring signal.

A measuring assembly comprises a line selector 20 and a line eliminator 30.

The line selector 20 is adapted to select a predetermined line of the spectrum and to measure this line is amplitude and in phase successively at the input and at the output of the spectrum. In the case of linear systems, the following magnitudes are then obtained, characterizing the system of frequency $f_i$ of the selected line: the amplitude at input $A_{Ei}$, the amplitude at output $A_{Si}$ and the input-output phase shift $\Phi_i$ from which the transmittance $H(f_i) = (A_{Si}/A_{Ei})e^{j\Phi_i}$. As will be seen hereinafter, the measurements are carried out by synchronous detection by means of a detection signal of frequency $f_i$ and of controlled phase so as to coincide with that of the selected line.

The line eliminator 30 is used for the measurements effected with a view to characterization of a non-linear system Q. The elimination of a line of predetermined frequency $f_i$ is effected by engendering an elimination signal having the same frequency and amplitude as the line to be eliminated but in phase opposition with respect to the latter. The elimination signal is added to the measuring signal applied to the input of the system, whilst the amplitude and the phase of the line at frequency $f_i$ are measured at the output of the system.

A control assembly 60 incorporating memories comprises a microprocessor 61 with its associated circuits and memories 62. This assembly 60 makes it possible to control the choice of the parameters of the measuring signal and the type of measurement (linear system or non-linear system) after manual or remote-controlled selection, to control the development of the sequences of measurements, to memorize the intermediate or definitive results of measurement, and to display these results and/or transfer them to a computer.

The different constituents of the analyzer will now be described in greater detail.

As shown on FIG. 1, the pseudo-random signal generator 12 includes a pseudo-random binary sequence generator 14 controlled by the driving oscillator 11 and a digital filter 15 receiving the binary signal from the generator 14 and producing the measuring signal.

The pseudo-random binary sequence generator 14 comprises a shift register 14a with k positions. At a first end, the register 14a receives the bit produced by a modulo 2 adder 14b having k inputs respectively connected to the k positions of the shift register; the shifting is performed at the rhythm imposed by the driving oscillator 11. At the opposite end, the register 14a delivers the successive bits forming the pseudo-random binary sequence.

The filter 15 receives the binary sequence to produce an analog signal with a limited frequency range and with a desired frequencies comb. The transfer function of the filter 15 is determined according to the desired spectral distribution of the lines in the measuring signal. When a spectral distribution is desired according to a white noise, the filter 15 converts the amplitude spectrum of the signal produced by the generator 14 to a rectangular amplitude spectrum.

Different parameters of the measuring signal, such as the covered frequency range, the number and spaced apart relationship of the lines and the amplitude of the lines are adjustable by acting on the frequency of the driving oscillator 11, the number of positions of the shift register 14a and the characteristics of the digital filter 15.

Figure 2:
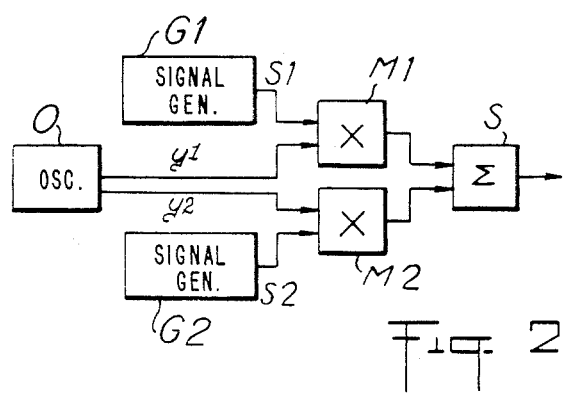
FIG. 2 is a more detailed diagram of a variant embodiment of the pseudorandom signal generator forming part of the device of FIG. 1.

The frequency range covered by means of such a generator is limited to some tens of MHz. The production of a pseudo-random signal in a higher frequency range is performed by means of the circuit illustrated by FIG. 2.

Pseudo-random signals S1, S2 of relatively low frequency are generated by two respective generators G1, G2 having a structure similar to that of the above described generator 14. The signals S1, S2 are combined with two respective carrier waves in multipliers M1, M2. The carrier waves y1 and y2 are in quadrature: $y1 = Y \cos 2\pi f_0 t$ and $y2 = Y \sin 2\pi f_0 t$, Y being a constant, $f_0$ being a predetermined frequency and t being the time. Waves y1 and y2 are produced by a high frequency oscillator O. The output signals of the multipliers are combined by means of an adder S which generates the desired high frequency pseudo-random signal.

Figure 3:
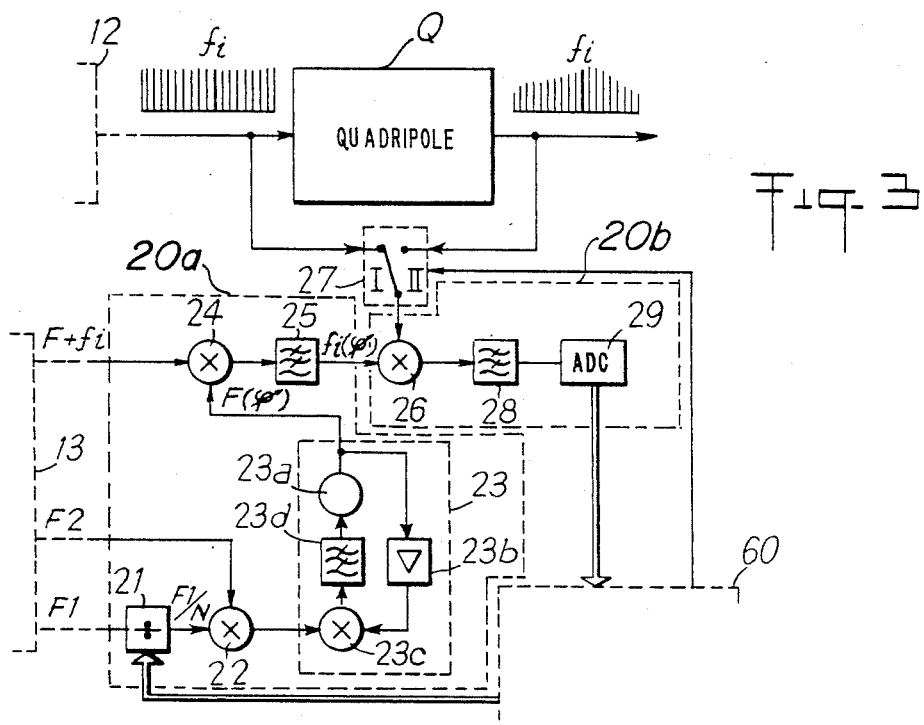
FIG. 3 is a more detailed diagram of the line selector forming part of the device of FIG. 1.

FIG. 3 illustrates an embodiment of the line selector 20, which comprises a circuit 20a producing a detection signal $s_{di}$ at frequency $f_i$ of the line selected and with controlled phase and a measuring circuit 20b.

The circuit 20a receives from the synthesizer a first square-wave signal at a fixed frequency $F_1$, a second signal at a fixed frequency $F_2$ and a third signal at adjustable frequency $F + f_i$ as a function of the selected line. The signal at frequency $F_1$ is applied to the input of a programmable frequency divider 21 which delivers a signal of frequency $F_1/N$, N being an adjustable integer. The signal at frequency $F_1/N$ is mixed with the signal at frequency $F_2$ in a mixer 22 of which the output signal is filtered by a pass-band filter 23 to obtain a signal of frequency $F_2 - F_1/N$. This latter signal is mixed with the signal at frequency $F + f_i$ in a mixer 24 of which the output signal is filtered in a filter 25 to produce the signal of frequency $f_i$. It is therefore necessary to verify the following relation:

$$F + f_i - \left(F_2 - \frac{F_1}{N}\right) = f_i, \text{ i.e.: } F = F_2 - \frac{F_1}{N}.$$

By way of example, the following is chosen F = 7.9 MHz, $F_1$ = 18 MHz, $F_2$ = 8 MHz and N = 180. To separate, at the output of the mixer 22, the signal at frequency 7.9 MHz from the signal at frequency 8.1 MHz, the filter 23 used is constituted by phase servo-control loop which, as is known per se, comprises a voltage-controlled oscillator 23a whose output signal, after passage in an amplifier 23b, is applied to a mixer 23c receiving furthermore the output signal from the mixer 22. The output of the mixer is connected by a low-pass filter 23d to the control input of the oscillator 23a. The output of this oscillator constitutes the output of the filter 23.

Figure 4:
FIG. 4 is a timing chart illustrating the mode of adjustment of the phase of the selection signal in the line selector of FIG. 3.
Figure 4:
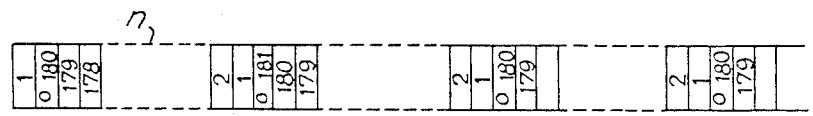
Figure 4:
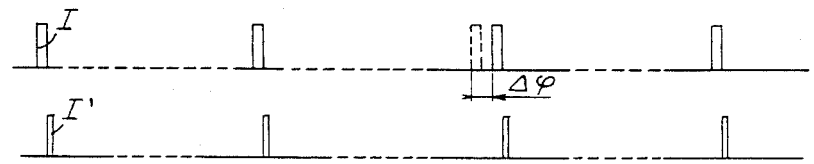

The variation of the phase of the detection signal $s_{di}$ is effected as follows (cf. FIGS. 3 and 4).

The programmable frequency divider 21 is constituted by a digital downcounter which is set at the value N (180) at the beginning of each cycle and counts down to zero at the rhythm of the signal at frequency $F_1$ (18 MHz). Upon each passage to zero of the contents N of the downcounter, two pulses I and I' are successively produced. Pulse I is applied to the mixer 22 and pulse I' controls the setting of the downcounter at the value N (180) for a new cycle. To make an elementary phase shift of the signal at frequency $F_1/N$ (100 kHz), at the beginning of a cycle, the downcounter is set at the value N+(181) or N−(179) depending on the sign of the desired phase shift. At the end of this new cycle, pulse I appears which an elementary delay or advance of ±1/F, which corresponds to an elementary delay or advance of ±360°/N, or ±2° with the chosen values, and the downcounter is reset again at the value N. In this way, any desired positive or negative phase shift may be effected at one time by modification of the value N by the quantity necessary in the course of a cycle, or on several occasions by addition of elementary phase shifts. The phase variation of the signal at frequency $F_1/N$ is transferred integrally, by transposition, on the signal $s_{di}$ at frequency $f_i$.

The measuring circuit 20b comprises a mixer 26 which receives, on the one hand, the variable phase signal $s_{di}$ and, on the other hand, either the measuring signal present at the input of the system Q or the signal present at the output of the system Q depending on the position of an electronic switch 27. The signal produced at the output of the mixer is filtered by means of a low pass filter 28 which allows the continuous component to pass. The amplitude of the signal $s_{di}$ being constant, this continuous component is equal to $C \cdot A_i \cdot \cos \phi_i$, C being a constant, $A_i$ being the amplitude of the selected line at frequency $f_i$ in the pseudo-random signal at the input ($A_{Ei}$) or at the output ($A_{Si}$) of the system (depending on the position of the switch 27), and $\phi_i$ being the phase shift between the signal $s_{di}$ and this line at the input ($\phi_{Ei}$) or at the output ($\phi_{Si}$) of the system. The assembly 26–28 constitutes a synchronous detector.

For characterization of a linear system, the switch 27 is firstly placed in position 1 in which it connects the mixer 26 to the input of the detector Q. The continuous component $C \cdot A_{Ei} \cdot \cos \phi_{Ei}$ at the output of the filter 28 is measured, converted in digital form by an analog-to-digital converter 29 and memorized in the control assembly 60 incorporating memories. As a function of the memorized value of this continuous component, the phase of the signal $s_{di}$ is then controlled automatically until it coincides with that of the line at frequency $f_i$. The component $C \cdot A_{Ei} \cdot \cos \phi_{Ei}$ then has its maximum value $C \cdot A_{Ei}$ which is memorized and which constitutes the measurement of the amplitude of the line of frequency $F_i$ at the input of the system. The switch 27 is then placed in position II in which it connects the mixer 26 to the output of the detector Q. The same operations are effected from where is drawn the information $C \cdot A_{Si}$ relative to the line at frequency $f_i$ at the output of the system. As indicated hereinabove, the system may then be characterized by its transmittance $H(f_i)=(A_{Si}/A_{Ei})e^{j\Phi_i}$, with $\Phi_i=\phi_{Si}-\phi_{Ei}$.

The same series of operations may then be carried out for all or certain other lines of the spectrum. For greater details concerning the control of the line selector, reference will be made to the flowchart of FIGS. 9, 10 and to the corresponding description given hereinafter.

Figure 5:
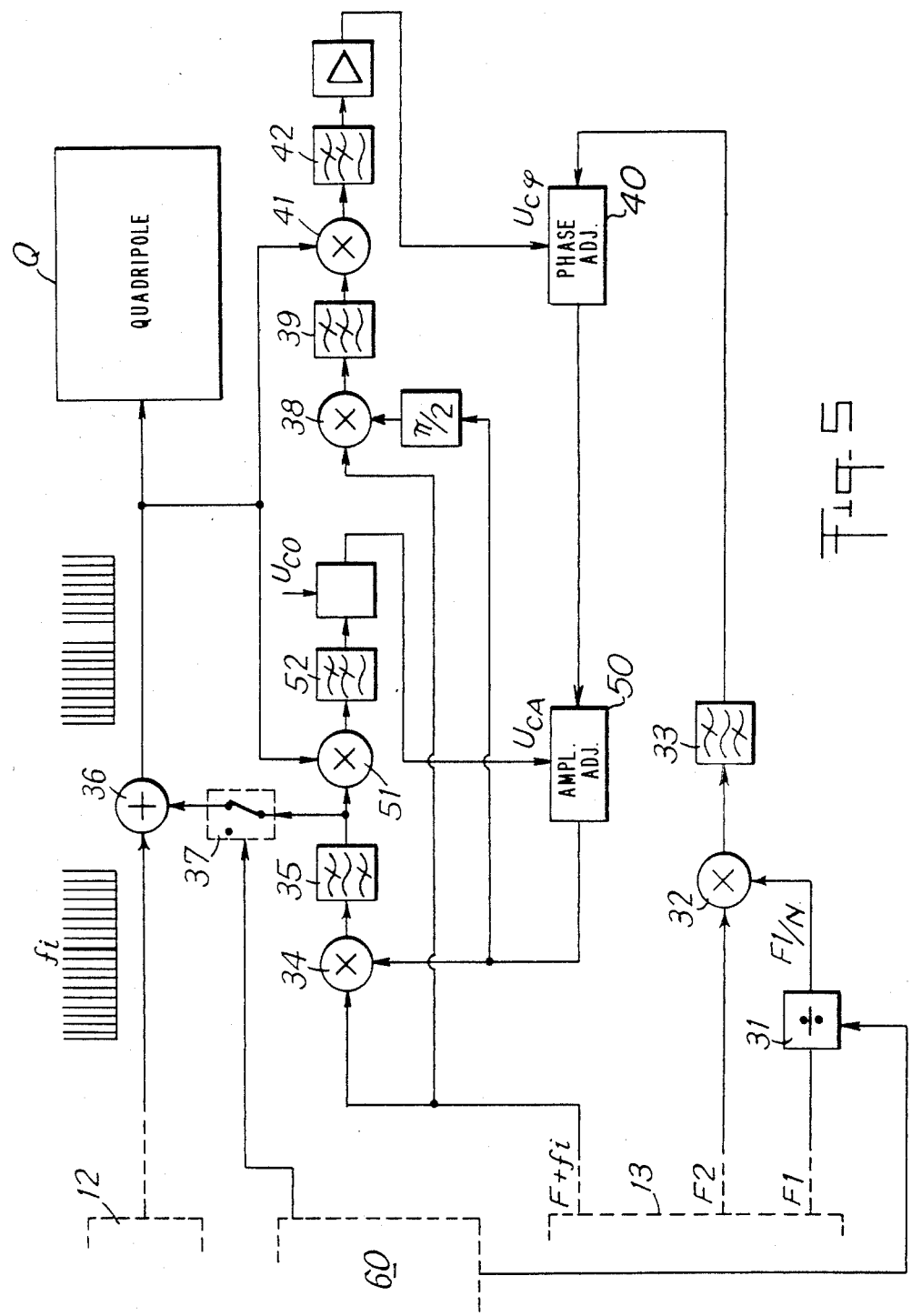
FIG. 5 is a more detailed diagram of the line eliminator forming part of the device of FIG. 1.

The line eliminator 30 (FIG. 5) is used for characterization of the non-linear systems. The function of this eliminator signal $s_{si}$ having the same frequency $f_i$ and amplitude $A_{Ei}$ as a selected line to be eliminated from the measuring signal applied to the input of the system Q, but having the opposite phase $-\phi_{Ei}$. The mode of functioning of the line eliminator may be qualified as synchronous or coherent rejection.

Like the line selector 20, the line eliminator 30 receives from the synthesizer 13 the signals at frequencies $F_1$, $F_2$ and $F+f_i$. A circuit comprising a programmable frequency divider by N 31, a mixer 32 and a pass band filter 33 furnishes a signal at frequency $F_2-F_1/N$ with controlled phase. This circuit 31, 32, 33 is identical to circuit 21, 22, 23 of the line selector 20. The signal at frequency $F_2-F_1/N$ successively passes through a fine phase adjusting circuit 40 and an amplitude adjusting circuit 50 before being applied to an input of a mixer 34. The other input of this mixer receives the signal at frequency $F+f_i$. The equality $F=F_2-(F_1/N)$ being verified, the mixer 34 furnishes, after filtering by a filter 35, a signal at frequency $f_i$. The phase and amplitude of this signal are controlled so that this signal constitutes the eliminating signal $s_{si}$ which is added by means of an adder 36 to the measuring signal produced by the generator 12, when an electronic switch 37 connected between the output of the filter 35 and the adder 36, is closed (position II). It is then the sum of the measuring signal and of the eliminating signal which is applied to the input of the system Q.

To effect fine phase adjustment of the signal at frequency $F_2-F_1/N$ and the adjustment of the amplitude of this signal, two magnitudes are elaborated, respectively representative of $C_i \cdot A_{Ei} \cdot \cos \phi_{Ei}$ and of $C_i \cdot A_{Ei} \cdot \sin \phi_{Ei}$, and the amplitude and phase of said signal are varied by means of circuits 40 and 50 until these two magnitudes are cancelled, $C_i$ being the amplitude of the signal $s_{si}$, $A_{Ei}$ being the amplitude of the residual line at frequency $f_i$ downstream of 36 and $\phi_{Ei}$ being the phase shift between this line and $s_{si}$.

The output signal from the amplitude adjusting circuit 50 is phase-shifted by a non-zero quantity, for example 90°, by means of a phase shifter whose output signal is mixed with the signal at frequency $F+f_i$ by a mixer 38. The output signal from the mixer is filtered by means of a filter 39 to produce a signal $s'_{si}$ at frequency $f_i$ in quadrature with the signal $s_{si}$.

The magnitude representative of $C_i \cdot A_{Ei} \cdot \sin \phi_{Ei}$ is produced by synchronous detection between the signal $s'_{si}$ and the signal present at the input of the system Q, downstream of the adder 36. This synchronous detection is effected by a mixer 41 whose output signal is filtered by a low pass filter 42 allowing the continuous component representative of $C_i \cdot A_{Ei} \cdot \sin \phi_{Ei}$ to pass. This component or a voltage representative thereof, is applied as control voltage $U_{C\phi}$ to the fine phase adjusting circuit 40.

A first rough phase adjustment is advantageously effected, the line eliminator not being connected (switch 37 open in position II) by means of the line selector as described hereinabove. The phase $\phi_{Ei}$ thus determined is offset by 180° and recopied in the programmable divider 31. The determination of $\phi_{Ei}$ being effected with respect to the reference constituted by signal $F_1$, a prepositioning of the phase of the signal $s_{si}$ at a value close to $-\phi_{Ei}$ is thus effected, taking into account the precision of determination of $\phi_{Ei}$ by the line selector.

When the line eliminator functions (switch 37 closed), the function of the circuit 40 is to effect a fine phase adjustment. Reference will be made to FIGS. 6 and 7. The circuit 40 comprises (FIG. 6) a monostable circuit 43 which delivers pulses I1 of fixed duration at frequency $F_2-F_1/N$. These pulses control a generator 44 of saw-teeth shown in FIG. 7 as DS1, which are applied to an input of the comparator 45. On another input, the comparator 45 receives the control voltage $U_{C\phi}$. When the amplitude of a saw tooth DS1 exceeds the voltage $U_{C\phi}$, the comparator 45 produces a signal which triggers off a second monostable circuit 46. This latter then produces a pulse I2 of fixed duration. The pulses I2 have the same frequency $F_2-F_1/N$ as the pulses I1 but are phase shifted with respect thereto by a quantity proportional to $U_{C\phi}$ in the range of adjustment offered for the duration of the saw-teeth DS1. In this way, phase adjustment is effected until the component $C_i \cdot A_{Ei} \cdot \cos \phi_{Ei}$ is cancelled. The pulses I2 are filtered by a low pass filter 47 centred on the frequency $F_2-F_1/N$ to deliver a sine-wave signal S2 at this frequency.

The magnitude representation of $C_i \cdot A_{Ei} \cdot \cos \phi_{Ei}$ is produced by synchronous detection between the signal $s_{si}$ and the signal present at the input of the system Q, downstream of the adder 36. This synchronous detection is effected by a mixer 51 whose output signal is filtered by a low pass filter 52 allowing the continuous component representative of $C_i \cdot AE_i \cdot \cos \phi_{Ei}$ to pass. This component is added to a predetermined fixed voltage $U_{CO}$ to constitute the control voltage $U_{CA}$ applied to the amplitude adjusting circuit 50.

A particular embodiment of the circuit 50 is illustrated in FIG. 8. The output signal from filter 33 is applied to the input of an amplifier stage 51 formed by a transistor T1 of which the gain is modified by acting on its dynamic load resistance, its point of functioning remaining unchanged. This point of functioning is determined by resistors R1, R2 forming a potential divider whose centre point is connected to the base of the transistor and a resistor R3 connecting the emitter of the transistor T1 to earth. The dynamic resistance is constituted by the parallel head-to-tail combination of two diodes D1, D2 through which the same DC current $I_c$ passes. The cathode of diode D1 and the anode of diode D2 have a common point connected by two respective capacitors C1, C2 to the output of stage 51 and to the input of an output amplifer stage 52. The cathode of diode D2 is connected to earth whilst the anode of diode D1 is connected to earch via a capacitor C3 and receives the current $I_c$. The latter is furnished by a separator transistor T2 mounted as follower, of which the base receives the control voltage $U_{CA}$ and of which the emitter is connected to earth by aresistor R4 and to diode D1 by a resistor R5. The cathode of a diode D3 is connected to the base of the transistor T2 and its anode is connected to the centre point of a potential divider R9 — R6. The anode of another diode D4 is connected to the base of T2 and its cathode is connected to the centre point of another potential divider R7 — R8. The transistor T2 furnishes the current $I_c$ representative of $U_A$, the diodes D3, D4 limiting the adjustment dynamics. Equilibrium of the circuit 50 is attained when $U_{CA}=U_{CO}$, i.e. when the component $C_i \cdot A_{Ei} \cdot \cos \phi_{Ei}$ is zero.

The line of frequency $f_i$ being eliminated in this way at the input of the system Q, the amplitude and phase of the line of the same frequency $f_i$ is effected at the output of the system, as in the case of linear system analysis. Amplitude information $A_{Si}$ and phase information $\phi_{Si}$ is then available.

FIGS. 9 to 11 show flowcharts of the development of measurements effected under the control of the assembly 60.

The parameters of the pseudo-random signal being determined, the frequency $f_i$ of the line to be selected and, if need be, to be eliminated, is chosen, for example by acting on a keyboard. As a function of the chosen value of $f_i$, the control device prepositions a programmable frequency divider included in the synthesizer 13 so as to obtain the frequency $F+f_i$ by division of the frequency of the control oscillator 11.

In the case of linear system, the measurement made at the input of the system is as follows (FIG. 9).

The switch 27 is placed in position I.

The quantity $C \cdot A_{Ei} \cdot \cos \phi_{Ei}$ is measured and its sign $S_{Ei}$ is memorized.

The phase $\phi_{di}$ of the signal $s_{di}$ is increased by a quantity $\Delta\phi$ per setting of the downcounter 21 to the value N+1 at the beginning of the cycle per downcount of this downcounter to come, the value N being repeated for the following cycles.

The quantity $C \cdot A_{Ei} \cdot \cos \phi_{Ei}$ is again measured and its sign $S'_{Ei}$ is again memorized.

If the product $S_{Ei} \cdot S'_{Ei}$ is positive (no sign change) the phase $\phi_{di}$ is again increased by $\Delta\phi$.

If the product $S_{Ei} \cdot S'_{Ei}$ is negative (passage through zero of $\cos \phi_i$), the obtained value $\psi_{Ei}$ of the phase $\phi_{di}$ is memorized, then the phase of $s_{di}$ is offset by 90° ($\phi_{Ei}=\psi_{Ei}-90°$) and the magnitude representative of the absolute value of amplitude $A_{Ei}$, converted into binary form by the converter 29, is memorized.

It will be noted that the determination of $\phi_{Ei}$ is made by firstly seeking the quadrature between $\phi_{di}$ and the line of frequency $f_i$ then by offsetting by 90° the phase of $\phi_{di}$. This modus operandi allows a better determination of $\phi_{Ei}$ as the search for the passage through zero of $\cos \phi_{Ei}$ is easier and more precise than the search for its maximum.

The measurement then made at the output is as follows (FIG. 10).

The switch 27 is placed in position II.

The phase of $s_{di}$ is prepositioned at the previously memorized value $\psi_{Ei}$.

The quantity $C \cdot A_{Si} \cdot \cos \phi_{Si}$ is measured and its sign $S_{Si}$ is memorized.

If the product $S_{Si} \cdot S'_{Ei}$ is negative ($S'_{Ei}$ being the last value memorized of the sign of $C \cdot A \cdot _{Ei} \cdot \cos \phi_{Ei}$ in the course of the measurement effected at the input), the phase $\phi_{di}$ is increased by $\Delta\phi$, the quantity $C \cdot A_{Si} \cdot \cos \phi_{Si}$ is measured and its sign $S'_{Si}$ is memorized; if $S'_{Ei} \cdot S'_{Si}$ is positive, the phase $\phi_{di}$ is again increased by $\Delta\phi$, until the product $S'_{Ei} \cdot S'_{Si}$ is negative.

If the product $S_{Si} \cdot S'_{Ei}$ is positive, the phase $\phi_{di}$ is decreased by $\Delta\phi$, the quantity $C \cdot A_{Si} \cos \phi_{Si}$ is measured and its sign $S'_{Si}$ is memorized; if $S'_{Ei} \cdot S'_{Si}$ is positive, the phase $\phi_{di}$ is again decreased by $\Delta\phi$, until the product $S'_{Ei} \cdot S'_{Si}$ is negative.

When $S'_{Ei} \cdot S'_{Si}$ is negative, the quantity $\Phi_i = \psi_{Si} - \psi_{Ei}$ is calculated and memorized, $\psi_{Si}$ being the last memorized value of the phase of $s_{di}$.

The phase of $s_{di}$ is then offset by 90° ($\phi_{Si}=\psi_{Si}-90°$) and the magnitude representative of the absolute value of the amplitude $A_{Si}$, converted by the converter 39, is memorized.

The different values $A_{Ei}, A_{Si}$ and $\Phi$ may then be displayed or transmitted to a computing member or simply be stored for subsequent processing.

In the case of non-linear analysis, the same measurements as hereinabove may be effected, the switch 37 being open. The operations are then the same (FIG. 11) after closure of switch 37:

The value $\phi_{Ei}$ previously calculated is increased by 180°.

The new value obtained is recopied in the line eliminator by prepositioning of the frequency divider 31: $\phi_{si}=\phi_{Ei}+180°$ ($\phi_{si}$ being the phase of signal $s_{si}$).

The complete elimination of the line at frequency $f_i$ is then effected by analog adjustment of the phase and amplitude by the circuits 40 and 50.

Finally, the measuring sub-program at the output (described hereinabove with reference to FIG. 10) is effected to obtain values $A_{Si}$ and $\phi_{Si}$ relative to the eliminated line.

Various modifications or additions may of course be made to the embodiment described hereinabove of the process and the device according to the invention, without departing from the scope of protection defined by the accompanying claims.

For example, the rough adjustment of the phase of the eliminating signal may be effected, not be recopying in the eliminator the previously measured phase $\phi_{Ei}$ offset by 180°, but by adjusting the phase shift produced by the divider 31 from other information for example drawn from the signal used for the fine phase adjustment. The line eliminator permanently receiving the signal applied to the input of the system to be studied, it then permanently effects a preadjustment of phase which, when it is connected, enables it to produce the elimination signal in reduced time.

What is claimed is:

1. A method for determining transfer characteristics of a system by spectral analysis, said system having a signal input and a signal output, said method comprising the steps of generating a pseudo-random measuring signal having a spectrum constituted by lines of predetermined frequencies spaced apart from one another, applying the measuring signal to said signal input terminal of said system, performing at least one first measurement step comprising the steps of selecting one of said lines of the spectrum of the measuring signal, generating a detection signal having a frequency equal to the frequency of the selected line, and making a comparison in phase and amplitude between the signal input and a signal output of the system by synchronous detection by means of the detection signal, and performing at least a second measurement step comprising the steps of selecting a line to be eliminated among said lines of the spectrum of the measuring signal, generating an elimination signal having the same frequency and amplitude as said line to be eliminated but having opposite phase, superposing said elimination signal to the measuring signal at the signal input to the system, and measuring the phase or amplitude or both at said signal output.

2. A method as claimed in claim 1, wherein said first measurement step comprises:
generating said detection signal having a frequency equal to the frequency of the selected line, and having a determined amplitude and an adjustable phase;
superposing said detection signal on the measuring signal at the signal input of the system, with the phase of said detection signal being adjusted so as to coincide substantially with the phase of the selected line at the signal input of the system, and measuring a value representative of the amplitude of the selected line at the signal input of the system;
supporting said detection signal on the signal at the signal output of the system, with the phase of said detection signal being again adjusted so as to coincide substantially with the phase of the selected line at the signal output of the system, and measuring a value representative of the amplitude of the selected line at the signal output of the system, and
recording the adjusted values of the phase of the detection signal and the measured values representing the amplitude of the selected line at said signal input and output.

3. A method as claimed in claim 2, wherein, for adjusting the phase of the detection signal, a first signal having a fixed frequency is generated, a second signal having a fixed frequency is produced by frequency division of the first signal, the frequency division ratio is modified during one or more periods of the second signal and the phase shift thus produced on the second signal is transposed on the detection signal.

4. A method as claimed in claim 1, wherein said second measurement step comprises:
generating said elimination signal having a frequency equal to the frequency of the line to be eliminated and having adjustable amplitude and phase, and
after superposing said elimination signal on the measuring signal at the signal input of the system, adjusting the phase of said elimination signal being in opposition with respect to the phase of the line to be eliminated and adjusting the amplitude of the elimination signal to be equal to the amplitude of the line to be eliminated.

5. A method according to claim 4, wherein to adjust the phase and amplitude of the elimination signal:
the phase of the elimination signal is prepositioned at a value close to that of the line to be eliminated;
a first adjustment signal is produced by mixing the elimination signal and the line to be eliminated;
a signal phase-shifted by a non-zero quantity with respect to the elimination signal and at the frequency of the line to be eliminated, is generated;
a second adjustment signal is produced by mixing said phase-shifted signal and the line to be eliminated, and
fine phase and amplitude adjustments of the elimination signal are performed by means of said first and second adjustment signals.

6. A method as claimed in claim 1, wherein one or more of the following characteristics of the measuring signal are adjustable: the frequency range covered, the number of lines, their spaced apart relationship and their amplitude.

7. A device for determining transfer characteristics of a system by spectral analysis, said device comprising:
a pseudo-random signal generator for generating a measuring signal to be applied to a signal input of said system, said measuring signal having a spectrum constituted by lines of predetermined frequencies spaced apart from one another;
a line selector comprising means for generating a detection signal having a frequency equal to the frequency of a selected line, switching means operable in a first position to connect a terminal to the signal input of the system and in a second position to connect said terminal to a signal output of the system, and measuring means having inputs respectively connected to said detection signal generating means and to said terminal for delivering values representing the amplitudes of the selected line at the signal input and output of the system and the phase shift of the selected line between said system signal input and output, and,
a line eliminator comprising means for generating an elimination signal having same frequency and amplitude as a line to be eliminated from the spectrum of the measuring signal, but having an opposite phase, and switching means operable to selectively connect said line eliminator to the signal input of said system so as to superpose said elimination signal to said measuring signal.

8. A device as claimed in claim 7, wherein said line selector comprises: synchronous detection means having a first input connected to said detection signal generating means and a second input connected to said terminal for delivering a signal representative of the phase shift between the signal received on said first and second inputs; and control means connected to said synchronous detection means to receive said signal representative of said phase shift and connected to said detection signal generating means to control the phase of said detection signal so as to substantially annul said phase shift.

9. A device as claimed in claim 8, wherein said detection signal generating means comprises: means generating a first signal of fixed frequency, a programmable frequency divider receiving said first signal of fixed frequency and delivering a second signal of fixed frequency, said control means being connected to said programmable frequency divider to control the division ratio thereof; means generating a third signal having a frequency varying as a function of the frequency of the selected line; and frequency transposition means connected to receive said second and third signals for generating said detection signal at the frequency of the selected line and with a phase adjusted in accordance with the phase shift imposed on said second signal by modification of said division ratio.

10. A device as claimed in claim 7, wherein said line eliminator comprises:
an adder having two inputs connected respectively to said measuring signal generator and elimination signal generating means, and an output for connection to the signal input of the system;
first synchronous detection means having inputs respectively connected to said elimination signal generating means and to the output of said adder for producing a first adjustment signal as a function of the amplitude and phase of the elimination signal;
a phase shifter connected to said elimination signal generating means for shifting the phase of the elimination signal by a predetermined fixed quantity;

second synchronous detection means having inputs respectively connected to said phase shifter and to the output of said adder for producing a second adjustment signal as a function of the amplitude and phase of the elimination signal, and phase adjustment and amplitude adjustment circuits connected to said first and second synchronous detection and to said elimination signal means and operative in response to said first and second adjustment signals to adjust the phase and amplitude of the elimination signal to values respectively opposite to the phase and equal to the amplitude of the line to be eliminated.

* * * * *

UNITED STATES PATENT AND TRADEMARK OFFICE
CERTIFICATE OF CORRECTION

PATENT NO. : 4,527,116
DATED : July 2, 1985
INVENTOR(S) : Antoine Sorba et al.

It is certified that error appears in the above-identified patent and that said Letters Patent is hereby corrected as shown below:

Column 11, line 16, "supporting" should read -- superposing --.

Signed and Sealed this

Twenty-fourth Day of December 1985

[SEAL]

Attest:

DONALD J. QUIGG

Attesting Officer

Commissioner of Patents and Trademarks